(12) United States Patent
Clauss

(10) Patent No.: US 6,888,542 B1
(45) Date of Patent: May 3, 2005

(54) ERROR RECOVERY IN A COMPUTER AIDED DESIGN ENVIRONMENT

(75) Inventor: James M. Clauss, Tigard, OR (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/238,075

(22) Filed: Jan. 27, 1999

(51) Int. Cl.⁷ ............................................... G06T 17/00
(52) U.S. Cl. ..................................................... 345/420
(58) Field of Search ............................. 345/964, 420; 700/182; 706/919; 714/2, 57

(56) References Cited

U.S. PATENT DOCUMENTS

| | | | |
|---|---|---|---|
| 5,790,780 A | * | 8/1998 | Brichta et al. ................. 714/46 |
| 5,815,154 A | * | 9/1998 | Hirschtick et al. ........... 345/853 |
| 6,232,982 B1 | * | 5/2001 | Harding ....................... 345/738 |

OTHER PUBLICATIONS

Barequet et al., Repairing CAD Models, 1992, IEEE, pp. 363–370.*
Weitzman, Artifical Intelligence in Engineering Design, 1992, Academic Press, pp. 452–459.*
Tong et al., Artifical Intelligence in Engineering Design, 1992, Academic Press, pp 452–459.*
Fischer et al., Design Envirnoments For Constructive And Argumentative Design, 1989, pp. 269–275.*
Lemke, Using Criticfs to Empower Users, 1990.*
Krause et al., Processing of CAD–Data–Conversion, Verification and Repair, 1997, ACM, pp. 248–254.*

* cited by examiner

Primary Examiner—Almis Jankus
(74) Attorney, Agent, or Firm—Fish & Richardson P.C.

(57) ABSTRACT

The present invention provides an improved error recovery method and apparatus for computer aided design (CAD) environments. When a failure is identified in a feature of a CAD assembly, a set of treatments is automatically provided for the failure from which to select. The set of treatments is based, at least in part, on the particular failure. In one embodiment, information to identify and/or illustrate one or more failures within a particular feature is collected and stored in persistent memory. Then, when the particular feature is indicated, the information can be retrieved and provided in various formats, including text, graphics, and/or procedures, to assist a user in better understanding the failures. In another embodiment, when a treatment is selected from a set of treatments for a particular failure, the selected treatment is automatically initiated.

28 Claims, 11 Drawing Sheets

ERROR RECOVERY IN A COMPUTER AIDED DESIGN ENVIRONMENT

FIELD OF THE INVENTION

The present invention pertains to the field of computer aided design. More particularly, this invention relates to the art of error recovery in a computer aided design environment.

BACKGROUND

Computer aided design (CAD) is widely used to design everything from automobiles and airplanes to video games and web pages. Like sculpting a physical object, a CAD design is often an assembly of features. An assembly starts out with one feature, like a block of clay, and additional features are added, removed, resized, reshaped, etc. In the virtual space of a CAD environment, a designer can create a plethora of features of almost any size or shape, assemble the features in countless variations, and view the assembly of features from almost any perspective. Assemblies can be vastly complex creations that include thousands of features representing three-dimensional solids, complex surface contours, moveable or flexible parts, and so on.

Those skilled in the art of computer aided design use the terms sketch, part, and assembly to refer to different levels of abstraction. For instance, a sketch can be a collection of two-dimensional geometric shapes and constraints, a part can be a collection of sketches and features, and an assembly can be a collection of parts. For the purposes of this patent, "feature" refers in general to an element within any CAD design, and "assembly" refers in general to any collection of features, including a sketch, part, or assembly, as those terms are understood in the art.

Features are often specified in terms of parameters which can be interpreted, or executed, by a CAD process to create or recreate an assembly. This type of feature-based parametric solid modeling makes it easier to save, retrieve, and edit assemblies. At the same time however, as with compiling computer languages such as C++, Fortran, and Pascal, properly executing an assembly of features often involves debugging the assembly. Every time a feature is added or edited and the assembly is executed, a number of errors may be encountered. For instance, resizing one feature may interfere with several surrounding features.

Depending on the CAD system, an error may cause sequential execution to terminate. That is, as soon as a feature fails, execution stops. In which case, a designer may go through several iterations of error correction and re-execution before all of the features of an assembly execute properly. This type of CAD system may provide some information about a failure to help the designer understand and correct each error. For more complex designs however, correcting one error at a time, and possibly creating additional errors with each change, can be exceptionally frustrating and time consuming.

Other CAD systems may continue sequential execution even if features fail. For each failed feature, an error or warning message is usually generated and the failed feature may be left out of the executed assembly. An error log may include a list of all the error and/or warning messages generated for an assembly. In which case, a designer may be able to correct several errors in the log before re-executing the assembly.

In this type of CAD system however, since features tend to build on each other, one failed feature can lead to several dependent failures. For even moderately complex assemblies, an error log can appear daunting even if only one or two primary features fail. For instance, if a primary feature fails for whatever reason, and the failed feature is not added to the assembly, every feature that builds on the failed primary feature has no point of reference. In which case, every secondary feature also fails and causes an error message to be added to the log. Even experienced designers can spend countless hours deciphering error logs to debug designs.

Those skilled in the art will recognize that the type of execution may depend on the type of assembly. For instance, features of a sketch may be executed simultaneously by a two-dimensional constraint solver, and features of a part may be executed sequentially as described above. No matter what type of assembly is being executed however, error recovery in CAD environments is often tedious, painstaking work.

An improved error recovery method and apparatus may improve productivity and usability of CAD systems.

SUMMARY OF THE INVENTION

The present invention provides an improved error recovery method and apparatus for computer aided design (CAD) environments. When a failure is identified in a feature of a CAD assembly, a set of treatments is automatically provided for the failure from which to select. The set of treatments is based, at least in part, on the particular failure.

In one embodiment, information to identify and/or illustrate one or more failures within a particular feature is collected and stored in persistent memory. Then, when the particular feature is indicated, the information can be retrieved and provided in various formats, including text, graphics, and/or procedures, to assist a user in better understanding the failures.

In another embodiment, when a treatment is selected from a set of treatments for a particular failure, the selected treatment is automatically initiated.

BRIEF DESCRIPTION OF THE DRAWINGS

Examples of the present invention are illustrated in the accompanying drawings. The accompanying drawings, however, do not limit the scope of the present invention. Like references in the drawings indicate similar elements.

DETAILED DESCRIPTION

Figure 1A:
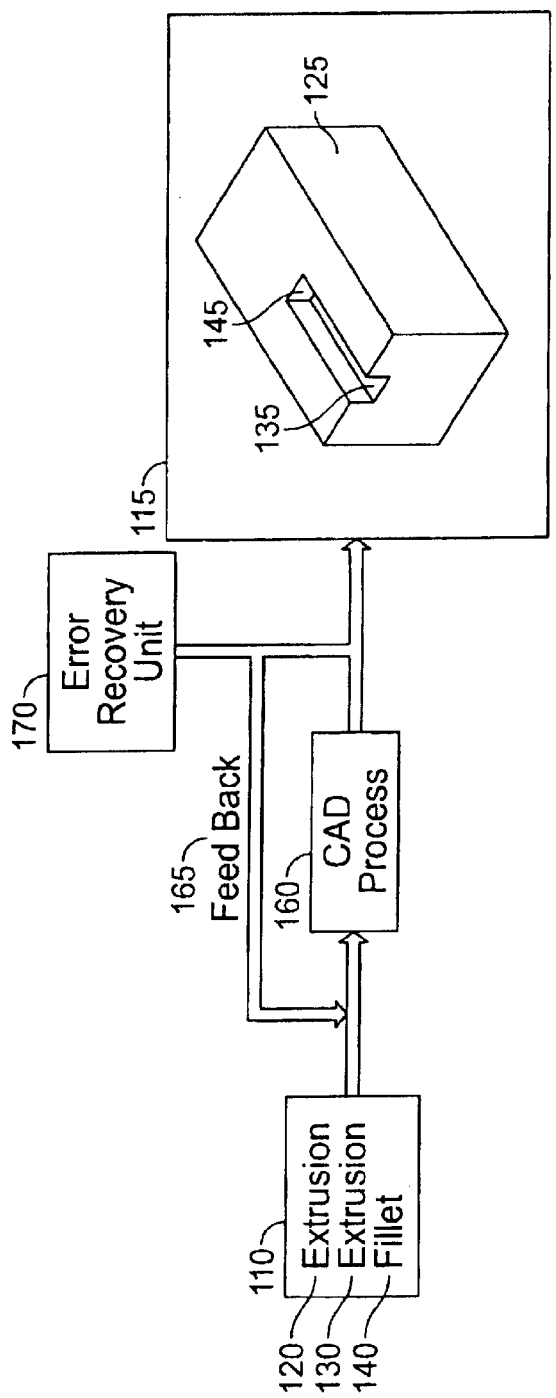
FIGS. 1A–1C illustrate one embodiment of a CAD system according to the teachings of the present invention.

FIG. 1 illustrates one embodiment of a computer aided design (CAD) environment according to the teachings of the present invention. Error recovery unit 170 identifies features that fail in a CAD assembly and automatically provides a set of treatments for the failure. As discussed more fully below, various embodiments of error recovery unit 170 also provide certain additional capabilities and advantages including identification of feature dependencies, automatic initiation of treatments, and persistent storage of information that can be used to identify and/or illustrate failures.

CAD process 160 receives input 110. Input 110 is feature-based parametric data that is executed by CAD process 160 to generate graphical output 115. Any number of CAD data formats and CAD processes known in the art can be used. In one embodiment, CAD process 160 executes sequentially, one feature at a time. If a feature contains an error, an error message is generated, the feature is not added to the assembly, and execution proceeds with the next feature. If a warning is encountered, the feature is partially successful so it will be added to the assembly, a warning message will be generated, and execution proceeds with the next feature.

As illustrated, input 110 is a very simple example of an assembly that includes only three features—extrusion 120, extrusion 130, and fillet 140. Extrusion 120 in input 110 is a parametric representation of the rectangular, three-dimensional extrusion feature 125 in output 115. For instance, the parametric data corresponding to feature 125 could be specified in terms of a two-dimensional rectangle of particular dimensions that is extruded into a third-dimension. FIG. 1B illustrates extrusion feature 125.

Next in the execution sequence is extrusion 130. Extrusion 130 in input 110 corresponds to the rectangular, three-dimensional extrusion feature 135 in output 115. Extrusion 135 removes a section of extrusion 125. Parametric data corresponding to feature 135 could be specified in terms of a two-dimensional rectangle based on face 126 in FIG. 1B, and extruded back into a third dimension. That is, parameters for face 126 are sent through feedback path 165 of FIG. 1A to be used as a parametric input for extrusion feature 135. In which case, feature 135 depends on feature 125. FIG. 1C illustrates primary extrusion feature 125 and secondary extrusion feature 135.

Last in the execution sequence is fillet 140. Fillet 140 in input 110 corresponds to the rounded surface feature 145. Fillets may also be referred to as blends or rounds. Parametric data corresponding to feature 145 could be specified in terms of an edge and a radius. For instance, edge 136 from FIG. 1C could be used as an input parameter for fillet 140. Over the length of edge 136, a cylindrical surface could be created having an axis parallel to edge 136 and having a particular radius. In which case, Fillet feature 145 depends on extrusion feature 135. The three features together create output 115.

Figure 2:
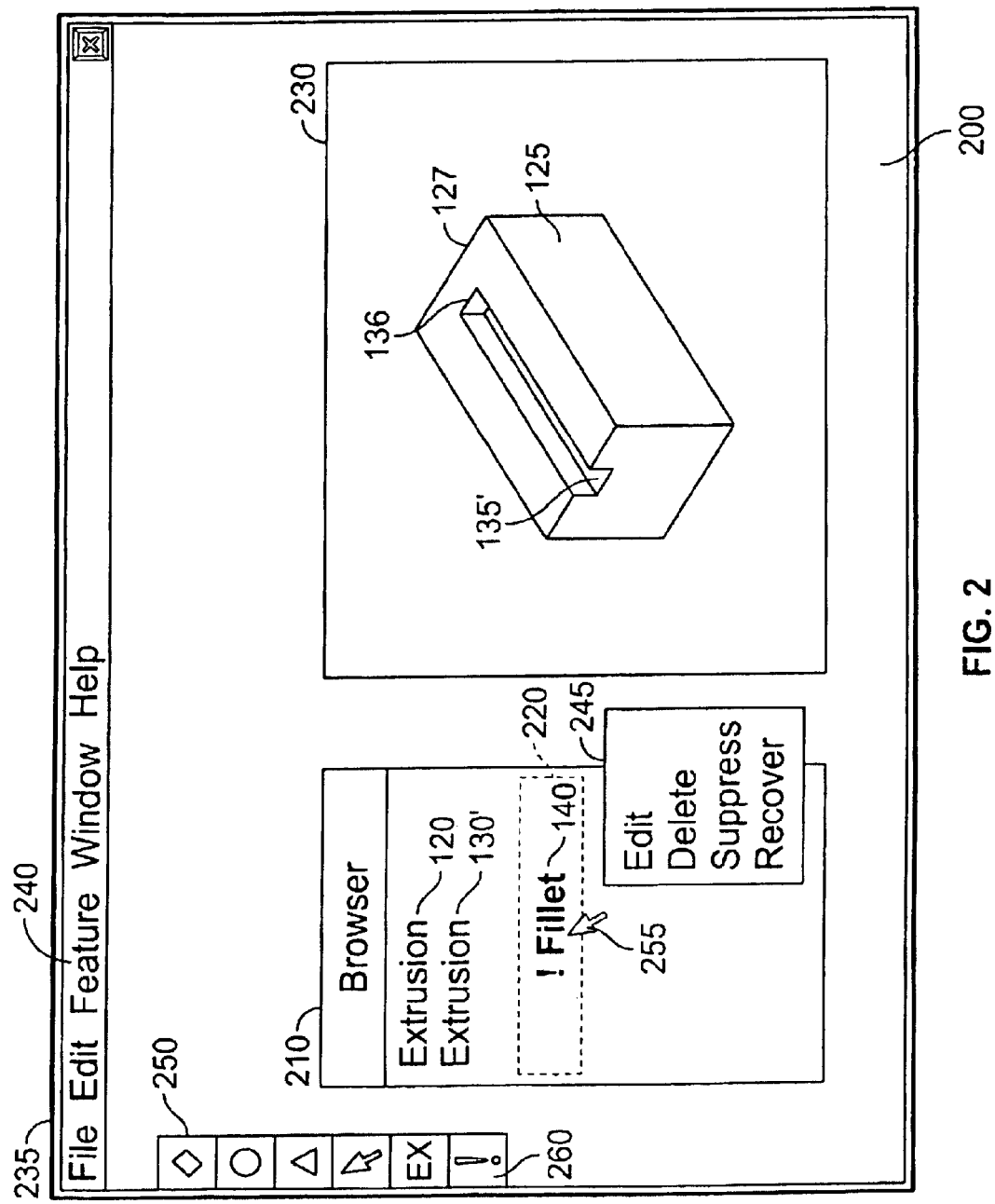
FIG. 2 illustrates one embodiment of a user interface.

FIG. 2 illustrates one embodiment of a user interface 200 for CAD process 160. User interface 200 includes a menu bar 235, a tool bar 250, a browser 210, and a work area or document 230. Any number of user interfaces could be used for CAD process 160.

In the illustrated embodiment however, tool bar 250 includes several command buttons to, for instance, create graphical objects of various shapes in document 230, cancel a command, execute an assembly, and, as discussed below, invoke an error recovery dialog. Menu bar 235 includes a number of menu items, including those known in the art for file commands, edit features, window selection, and help information, as well as a feature menu 240 which, as discussed below, can also be used to invoke an error recovery dialog.

Browser 210 provides a list of features in the assembly. Browser 210 can be used to perform various tasks on features. For instance, in one embodiment, placing cursor 255 over a feature in browser 210 and pressing a right mouse button opens pop-up menu 245. From menu 245, an edit dialog can be opened to change feature parameters. A feature can also be deleted or suppressed using menu 245. And, as discussed below for failed features, an error recovery dialog can be started from menu 245.

Figure 1C:
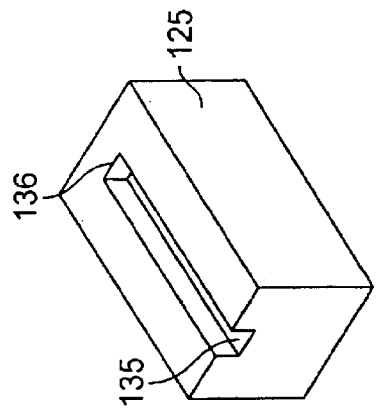
Figure 1B:
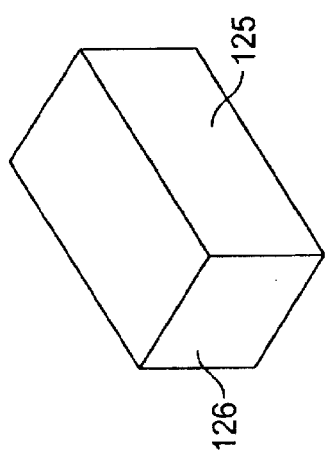

Even in the simple CAD assembly illustrated in FIGS. 1A–1C, several errors could be generated. For instance, as shown in FIG. 2, extrusion 135 has been modified. Modified extrusion 135' extends further through extrusion 125. Edge 136 is now very close to edge 127. When CAD process 160 attempts to execute fillet 140 on edge 136, there is not enough room between edge 136 and 127 to round edge 136 using the radius specified in fillet 140. As a result, fillet 140 fails, as designated in browser 210 by error marker 220. The failed feature is not added to the assembly in document 230. Fillet 140 can be designated in any number of ways in browser 210, such as highlighting, flashing, or reformatting the text.

CAD process 160 generates an error message for fillet 140. Any number of error message formats may be used. In one format, an error message includes a short text description, a feature identifier, a failure type (error or warning), and an error identifier.

Figure 3A:
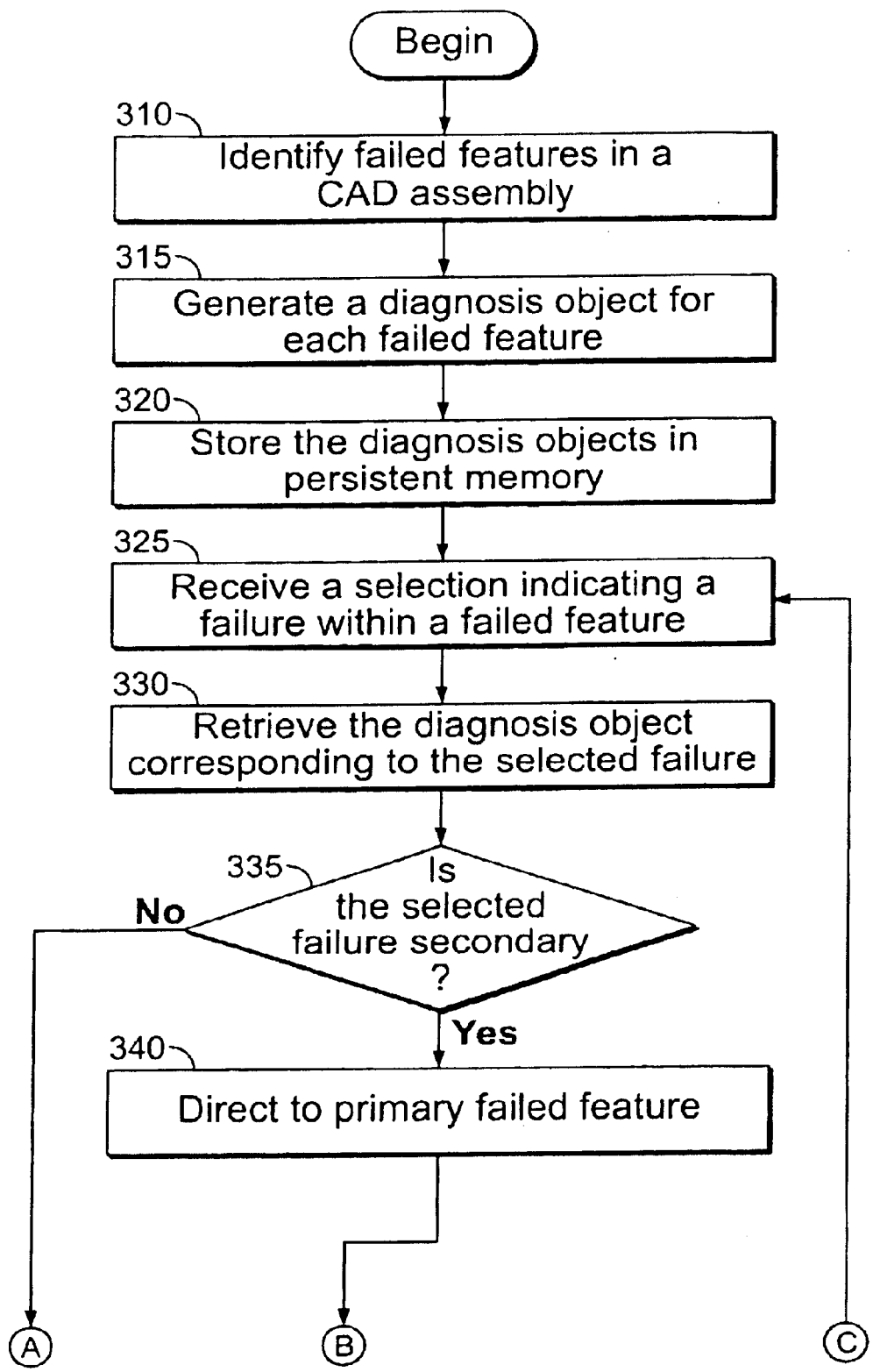
FIGS. 3A and 3B illustrate a process of one embodiment of the present invention.
Figure 3B:
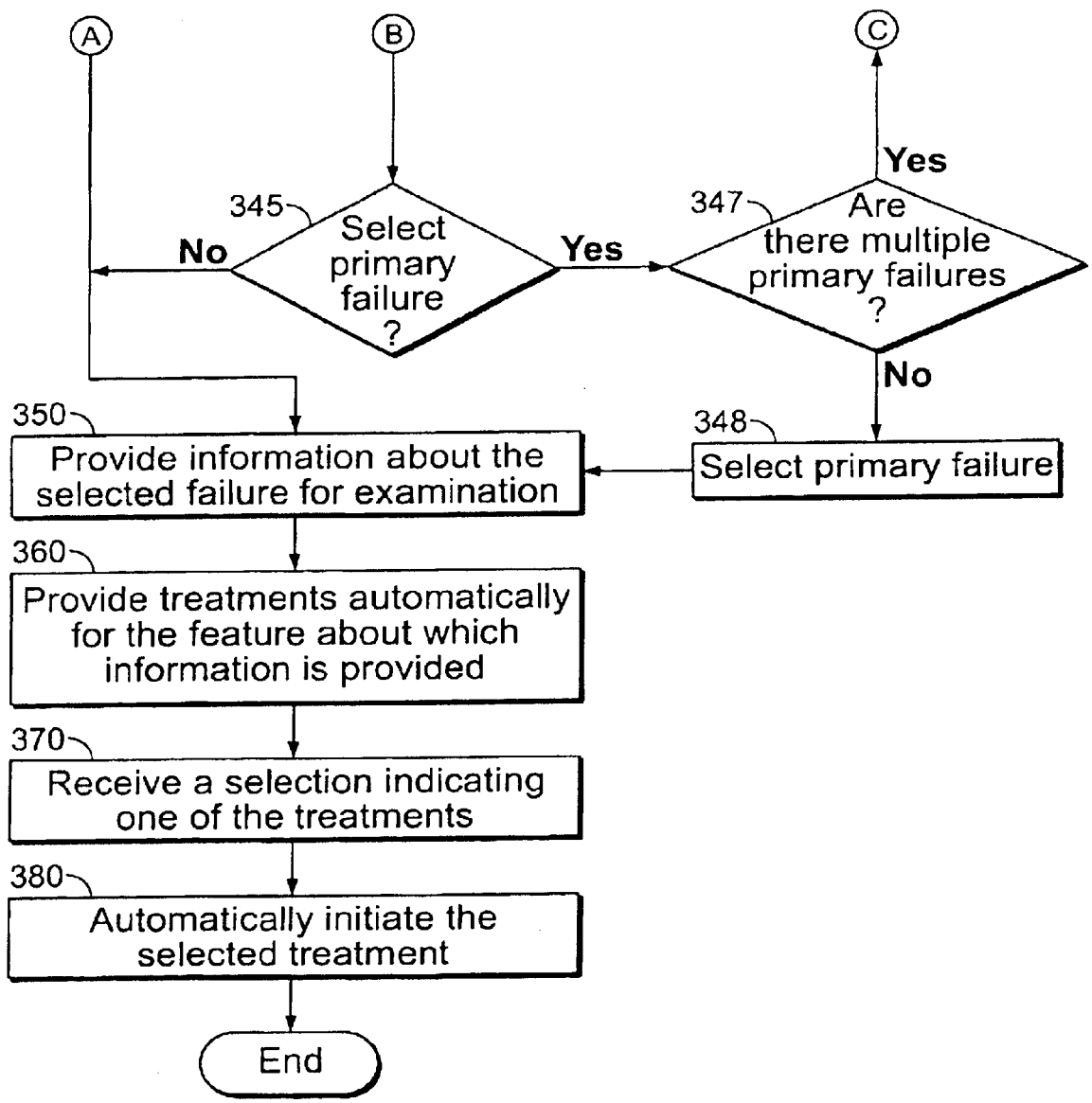

FIGS. 3A and 3B illustrate the process of one embodiment of the present invention. In general, the invention identifies a feature that fails and automatically provides a set of treatments that are applicable to the particular failed feature. In the illustrated embodiment, a number of additional functions and advantages are also described.

In step 310, error recovery unit 170 identifies failed features in a CAD assembly. In the example shown in FIG. 2, there is only one failed feature—fillet 140. In one embodiment, error recovery unit 170 monitors the output of CAD process 160 as an assembly is executed. If an error or warning message is detected, then a failure is identified.

In step 315, error recovery unit 170 generates a diagnosis object for each failed feature. A diagnosis object contains information to identify and/or illustrate at least one failure in a corresponding feature. The information can be generated based on the output stream and feedback path of CAD process 160. The information may include the failure type (error or warning), the text message generated by CAD process 160, an error identifier generated by CAD process 160, an identifier of the assembly to which the failed feature belongs, an identifier of the failed feature itself, an instance transform for the failed feature, geometry information, a coordinate set, a pointer to a list of feature identifiers for features on which the failed feature depends, etc. A diagnosis object may contain information for multiple failures within a single feature, such as a dependent failure due to a failed primary feature as well as an independent design failure.

In the example shown in FIG. 2, fillet 140 includes only one failure for which a diagnosis object will be generated.

Depending on CAD process 160, the error message may simply say something like "design execution error" or it may say something like "error—fillet radius too large." The fillet is not dependent on a failed feature, but it is dependent on modified extrusion 130', which is dependent on extrusion 120. As discussed below, depending on what information error recovery unit 170 later provides based on the diagnosis object, the set of dependent features may or may not be referred to in the diagnosis object.

In step 320, the diagnosis objects are stored in persistent memory. For instance, error recovery unit 170 may generate a working copy of a diagnosis object in main memory or cache and maintain a copy of the diagnosis object in nonvolatile memory. In which case, a user does not have to work on errors immediately after execution. In many cases, enough information is stored with the diagnosis object to identify and/or illustrate a failure without the necessity of re-executing the entire assembly.

In step 325, error recovery unit 170 receives a selection indicating a failure within a failed feature. As alluded to above, a failure can be indicated and an error recovery dialog entered in any number of ways. As shown in FIG. 2, a right mouse button can be used to open pop-up menu 245. In menu 245, a user can select a recover option for a failure. Alternately, a user could select error recovery command 260 from tool bar 250, and then select a failure. In yet a third example, under feature menu 240, an error recovery option could also be provided.

In response to a selection indicating a failure in a failed feature, error recovery unit 170 retrieves a diagnosis object corresponding to the failed feature in step 330. If the diagnosis object indicates that the selected failure is a secondary failure in step 335, error recovery unit 170 directs the user to a primary failed feature in step 340. For instance, error recovery unit 170 may provide a message saying, "The failure you have selected is secondary. Would you like to address a primary failed feature first?"

In step 345 of FIG. 3B, if the user indicates "yes," error recovery unit 170 can retrieve diagnosis objects for any primary failed features on which the selected failure depends based on the information stored in the diagnosis object for the indicated failed feature. In step 347, if there is only one primary failed feature having one primary failure, error recovery unit 170 selects the primary failure in step 348 and provides information about the selected primary failure in step 350. If there are multiple primary failures, error recovery unit 170 returns to step 325 so the user an select from the primary failures. Otherwise, if the user indicates "no" in step 345, or if the selected failure is not secondary in step 335, error recovery unit 170 provides information about the originally selected failure in step 350.

Figure 4:
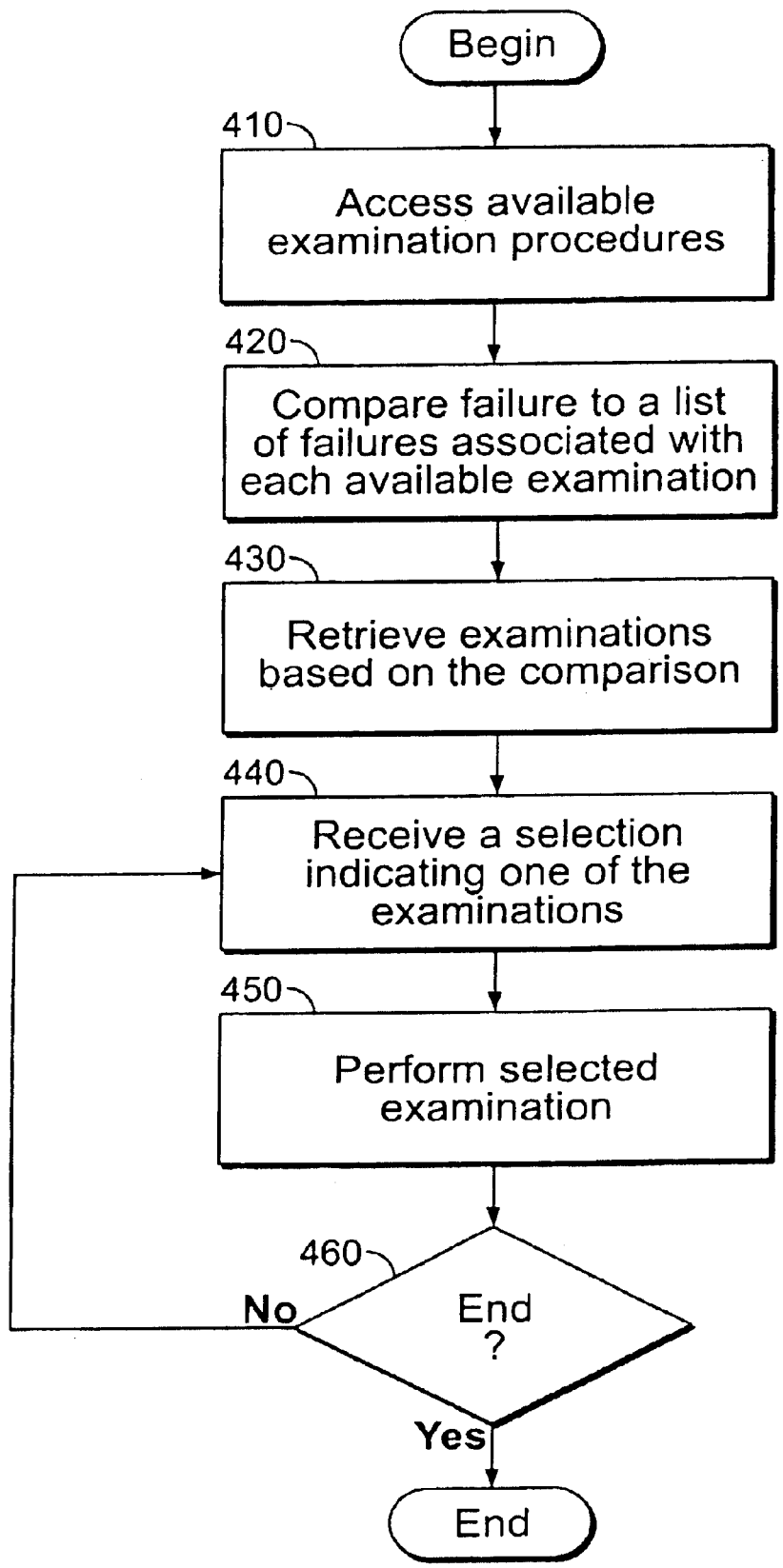
FIG. 4 illustrates one embodiment of a process to select examination procedures for a particular failure.

In step 350, error recovery unit 170 provides information about the selected failure within the respective failed feature for the user to examine. The examination is based on the diagnosis object and is comprised of one or more examination procedures performed by error recovery unit 170. FIG. 4 illustrates one embodiment of how error recovery unit 170 may select which examination procedures are applicable to a particular diagnosis object. In step 410, error recovery unit 170 accesses a data structure containing a number of available examination procedures. Associated with each procedure is a list of failures to which the examination applies. In step 420, error recovery unit 170 compares the failure in the diagnosis object to the list of failures for each procedure. In step 430, examinations are retrieved based on the comparison. In step 440, a selection is received indicating one of the applicable examination procedures, and, in step 450, the procedure is performed. Then, a user has an opportunity to perform, or re-perform, additional examinations in step 460.

In the example of FIG. 2, the radius of fillet 140 is too large for the amount of space left between edges 127 and 136. In which case, the error message generated by CAD process 160 may indicate that "a design failure occurred." An applicable procedure may display the text message generated by CAD process 160 as well as a more detailed text message based on additional information stored in the diagnosis object. A more detailed message may say "The radius of fillet 140 is too large." An additional applicable procedure may calculate an acceptable range for the radius. In which case, a detailed message may say, "The radius of fillet 140 is too large. A maximum acceptable radius is 2.34 cm."

In addition to a textual description, error recovery unit 170 may provide a graphical view of the assembly for examination in step 350 of FIG. 3B. Assemblies can be very complex creations though, and a particular feature may be comparatively small. Depending on the perspective from which an assembly is viewed, a particular feature may not be visible at all. Moreover, a failed feature may not execute and so it may not appear in the assembly. Therefore, in order help a user locate where a failed feature belongs, error recovery unit 170 may create a representation of the failed feature based on the diagnosis object and designate the representation in the assembly.

Several approaches can be taken to designate a representation of a failed feature. Based on various kinds of data such as an identifier of the assembly, an identifier of the feature, and the geometry of the feature, error recovery unit 170 can invoke actions within user interface 200 and CAD process 160 to provide, for instance, a toggle button to alternately highlight and hide the representation of the feature, a sonar effect in which animated rings zero in on the representation, and a magnified view of the representation centered in the document 230.

Figure 5:
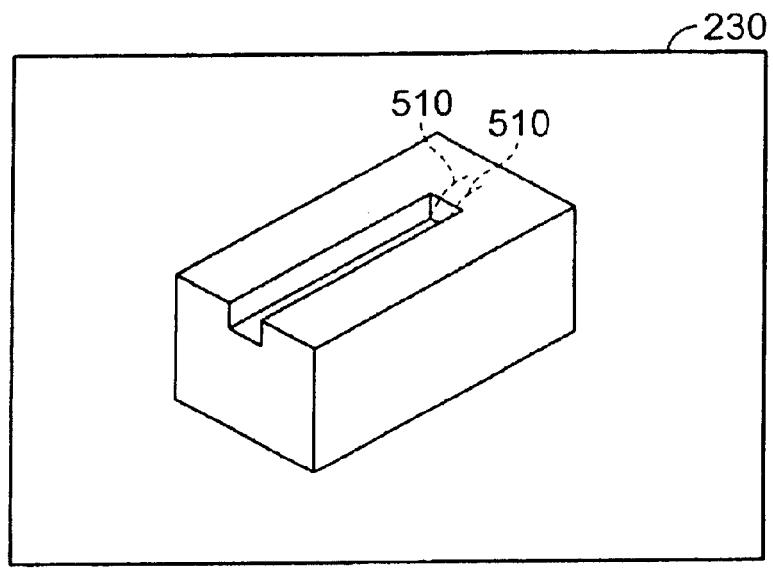
FIG. 5 illustrates one embodiment of a representation of a failure in a failed feature.

A representation may include a wire frame or a set of one or more edges of the failed feature, one or more surfaces of the failed feature, or any other form of graphical icon or identifier that may be readily recognizable to a user. For example, a representation of failed fillet 140 from FIG. 2 is shown in FIG. 5. The geometry of fillet 140 was stored in the diagnosis object. Arcs 510 are generated by error recovery unit 170 based on the geometry of fillet 140 and added to the graphical image of the assembly in document 230. Arcs 510 extend out into space. That is, when CAD process 160 attempted to execute fillet 140 to round edge 136, the radius specified for the fillet would have extended the surface outside the three-dimensional assembly. Viewing the representation of the failed feature in the assembly makes it easier to understand the error.

Figure 6A:
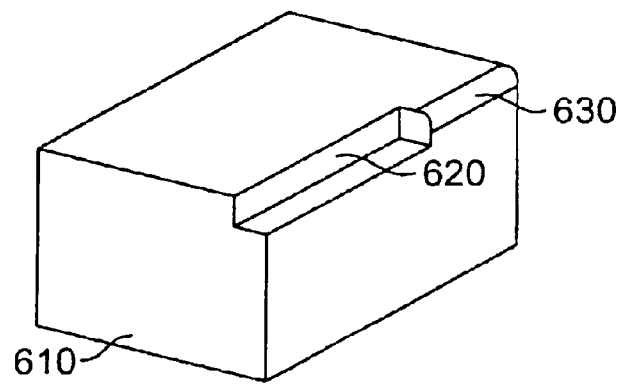
FIGS. 6A and 6B illustrate one embodiment of a lost dependency failure.
Figure 6B:
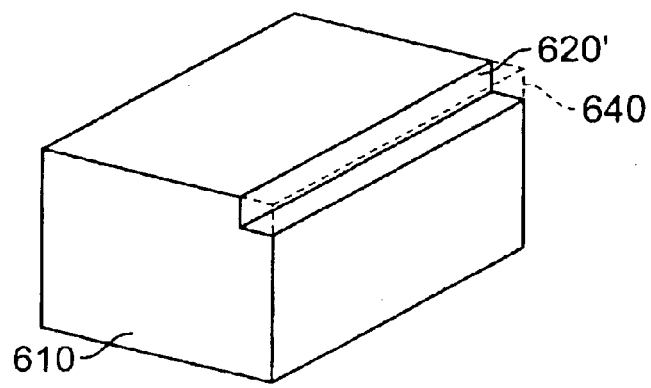

Some examination procedures are almost universally applicable. For instance, the procedure described above to display an error or warning message generated by CAD process 160 applies to almost all failures. A procedure to display a graphical representation of a failed feature, however, is not always applicable. For instance, in FIG. 6A, an assembly includes three features—extrusion 610, extrusion 620, and fillet 630. In FIG. 6B, extrusion 620' has been modified so that it extends all the way through extrusion 610. The edge created by extrusion 610 on which fillet 630 depends does not exist in the assembly shown in FIG. 6B. That is, fillet 630 has lost its dependency. For lost dependency errors, there is no reference point at which a representation of the failed feature can be attached.

In which case, error recovery unit 170 may step through execution of the CAD assembly so that a user can see at what point the dependency becomes or is lost. A dependency becomes lost when it is generated by one feature and then eliminated by execution of another feature. Alternately, a dependency may never be generated at all. In which case, the dependency is determined to be lost only when the dependent feature fails to execute.

In either situation, error recovery unit 170 may invoke CAD process 160 to sequentially execute the CAD assembly. Since a large number of features may precede the failed feature, the CAD assembly could be executed up to the point at which the dependency becomes or is lost. Then, execution could back up one or more steps, and proceed while displaying the assembly.

The assembly could be executed in "slow motion" and features, or features on which the failed feature depends, could be designated in the display of the assembly as they are executed. As with the representation of a failure described above, various approaches such as highlighting, sonar animation, zooming, and so on, can be used to designate features whiling stepping through execution.

Execution could also pause after each feature is executed, or after features on which the failed feature depends are executed. Execution could continue to pause until instructed to proceed by a user. Numerous additional approaches and combinations of these and other approaches are also possible.

In the example shown in FIG. 6B, if the dependency becomes lost, as opposed to never being created, then the geometry of the lost dependency could be used to display a representation of the lost dependency after it is eliminated by execution of extrusion 620'. Representation 640 illustrates where the lost edge is positioned in extrusion 610. From representation 640, it is easier to see what happened to the lost dependency.

Examination procedures can be specifically designed for particular failures, such as the lost dependency failure described above. In one embodiment, specific examination procedures are provided for a set of common failures for which particularly informative types of examinations can be accurately predicted. Based on the description provided herein, those skilled in the art will recognize that countless examination procedures can be created for numerous particular failures. The number and sophistication of examination procedures depends primarily on the available processing power and the time and money software developers are willing to invest.

Figure 7:
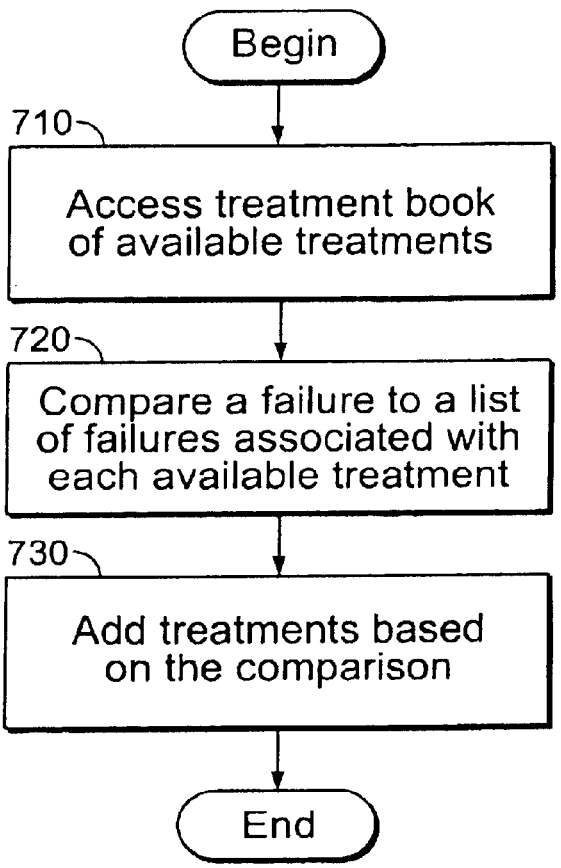
FIG. 7 illustrates one embodiment of a process to generate a set of treatments for a particular failure.

Returning to FIG. 3B, in step 360, error recovery unit 170 provides a set of treatments for the failed feature. In one embodiment, a set of all available treatments are stored in a data structure, or treatment handbook, similar to the data structure described above with reference to FIG. 4 for examination procedures. Each treatment in the treatment handbook has associated with it a list of failures to which the treatment is applicable. As shown in FIG. 7, error recovery unit 170 accesses the treatment handbook in step 710. In step 720, a failure is compared to a list of failures associated with each treatment. In step 730, treatments are added to a set of treatments based on the comparison.

Treatments may include edit, delete, suppress, re-order, and a variety of targeted edits. Some treatments may be universally applicable. For instance, virtually any feature can be edited, deleted, or suppressed. Other treatments may only be applicable to certain types of failures. Examples of treatments are discussed more below.

Returning again to FIG. 3B, in step 370, a selection is received indicating one of the treatments. A selection can be made in any number of ways. In one embodiment, the set of treatments are listed in a window and the user picks one with a mouse. Then, in step 380, the treatment is automatically initiated or implemented.

In one embodiment, if a user selects an edit treatment, the error recovery dialog is closed, an editor user interface is invoked, and the assembly is displayed in the interface. Usually, the same editor used to create the assembly is invoked for an edit treatment. Once in the editor, and after having identified and/or illustrated the failure in the error recovery dialog, a user should be adequately prepared to make whatever changes are necessary to recover from the error.

In transitioning from error recovery to editor, error recovery unit 170 may direct the editor to zoom in on the failed feature. Similarly, error recovery unit 170 may designate an executed feature on which the failed feature depends using highlighting or some form of animation. Numerous other approaches can be used to provide continuity from the error recovery dialog to the editor.

Under certain circumstances, a user may decide that it is best to delete a feature or suppress a feature and deal with it later. In one embodiment, both delete and suppress treatments can be fully implemented by error recovery unit 170 without additional user input. Using an assembly identifier and feature identifier stored in the diagnosis object, error recovery unit 170 can instruct an editor to locate the failed feature and remove the feature from the feature sequence or prevent the feature from executing without removing it.

Figure 8A:
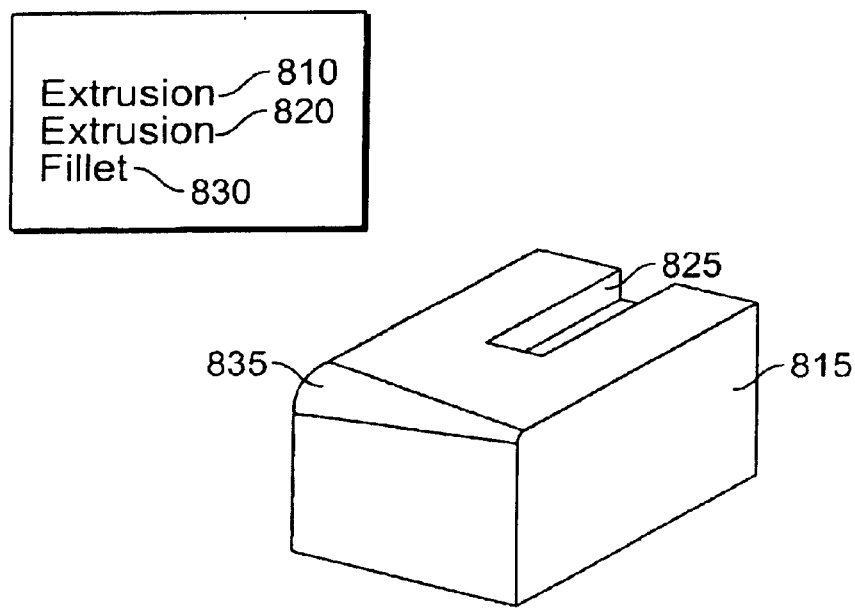
FIGS. 8A and 8B illustrate one situation in which a re-order treatment is applicable.

The re-order treatment is applicable to fewer failures than the more general edit, delete, and suppress treatments. FIG. 8A illustrates a situation in which a re-order treatment may be applicable depending on the CAD system used. Again, this is a very simple assembly including only three features—extrusion 810 corresponding to extrusion 815, extrusion 820 corresponding to extrusion 825, and fillet 830 corresponding to fillet 835. The features are executed in order starting with extrusion 810 and ending with fillet 830. Fillet 830 is a variable radius fillet. That is, the radius is larger at one end than the other and the radius linearly decreases over the length of the edge on which the fillet depends.

If extrusion 825 is extended all the way through extrusion 815, the CAD process may find multiple edges when it is expecting to find a single edge on extrusion 815 to which fillet 835 is to be added. CAD process 160 may generate a warning message but proceed to generate fillet 835 on each remaining part of the edge of extrusion 815.

Figure 8B:
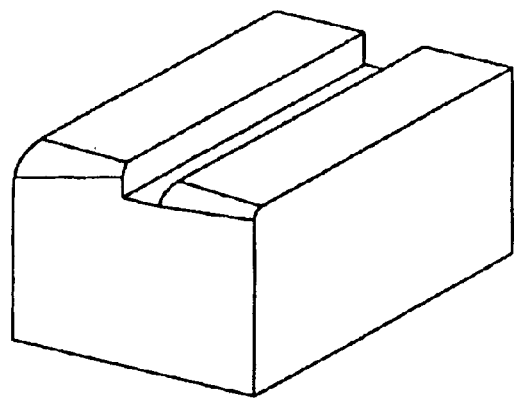

FIG. 8B illustrates one embodiment of what may result. Rather than linearly decreasing the radius of the fillet over the entire length of the edge, CAD process 160 started each edge section at the larger radius and ended each edge section at the smaller radius. In this situation, if the execution sequence were changed so that fillet 830 were performed before extrusion 820, the failure would not occur. Therefore, re-order should be included in the set of applicable treatments. In various embodiments, error recovery unit 170 may direct a user to re-order the fillet and initiate a re-order user interface. Alternately, if the re-order treatment is selected, error recover unit 170 may perform the reorder treatment without additional user intervention by invoking an editor similar to the way in which the delete and suppress treatments are performed. In another embodiment, the re-order treatment may also be tailored to the situation to provide a message such as, "Re-order the execution sequence to execute fillet 830 prior to extrusion 820."

Figure 9A:
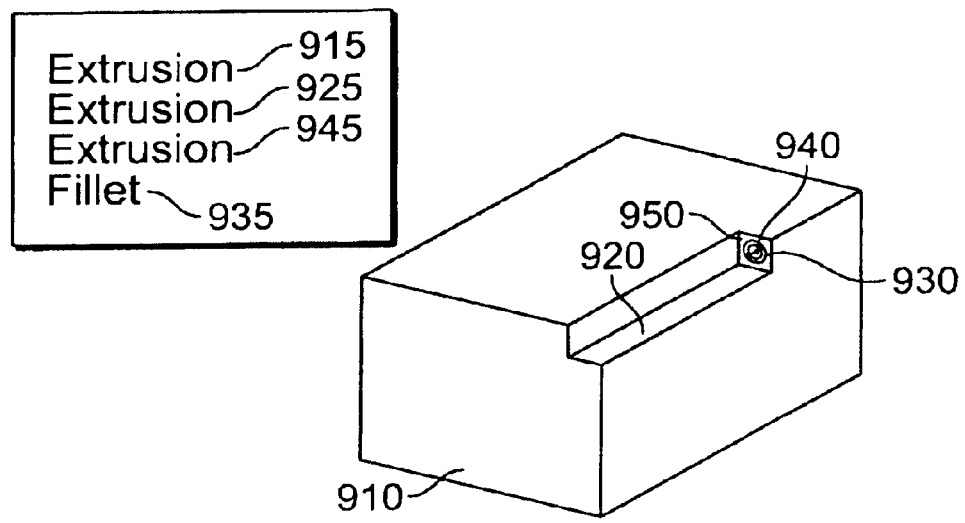
FIGS. 9A–9C illustrate one embodiment of a lost dependency failure and a secondary failure.

FIGS. 9A–12 demonstrate one embodiment of an error recovery dialog as applied to a lost dependency error and a secondary error. FIG. 9A illustrates the original assembly. The assembly has only four features 910, 920, 930, and 940, generated from sequentially executed features 915, 925, 945, and 935. Feature 940 is a cylindrical extrusion into face 950 of extrusion 920. Feature 930 is a fillet around the circular edge of cylindrical extrusion 940 in face 950 of extrusion 920.

Figure 9B:
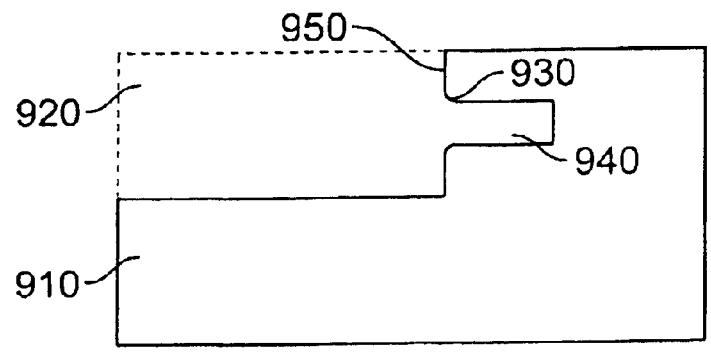

FIG. 9B illustrates a cross sectional view of the assembly. Extrusion 920 depends on extrusion 910. Cylindrical extrusion 940 depends on extrusion 920 at face 950, and extends into extrusion 910. Fillet 930 rounds the opening to extrusion 940 and depends on it.

Figure 9C:
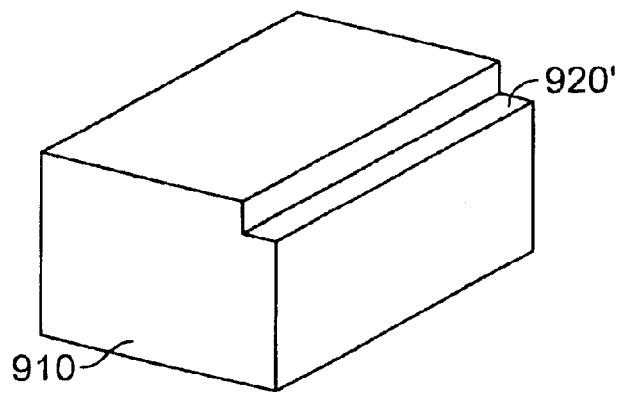

FIG. 9C illustrates the assembly as amended. Feature 920' has been extended all the way through feature 910. Face 950 on which cylindrical extrusion 940 depends has been removed entirely, creating a lost dependency error. In which case, cylindrical feature 940 is not added to the assembly, and becomes a primary failure which causes the secondary failure of fillet 930.

Figure 10:
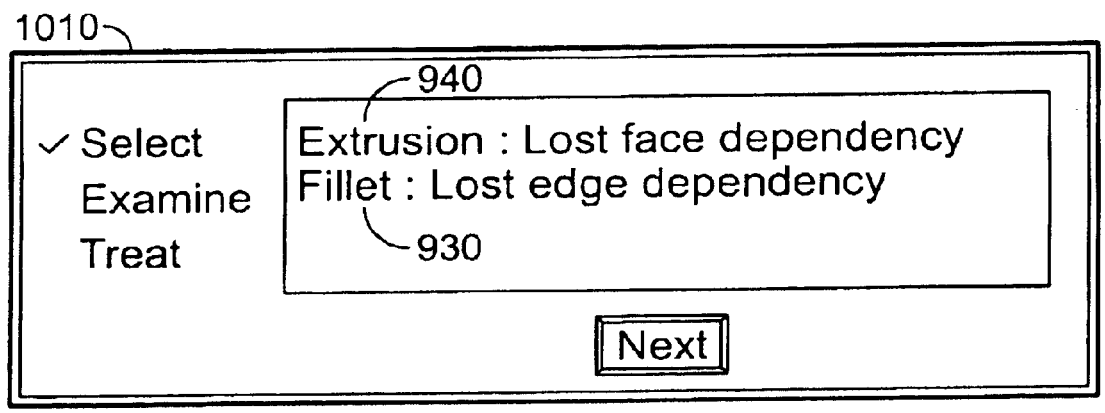
FIGS. 10, 11, and 12 illustrate one embodiment of an error recovery dialog.
Figure 10:
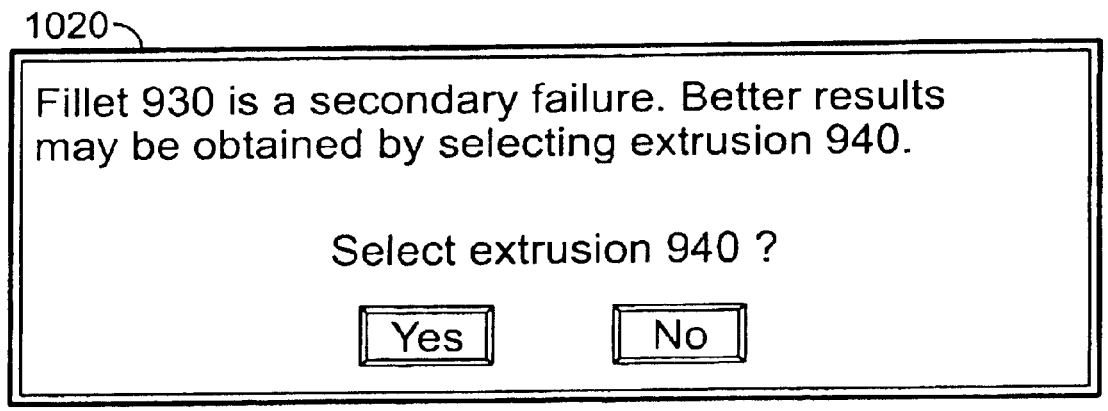

Once an error recovery dialog is entered using any of a number of approaches including those discussed above, a select window 1010 is opened as shown in FIG. 10. If a user selects fillet 930 and clicks on NEXT, window 1020 may be opened. In window 1020, a user is directed to a primary failure and given an opportunity to examine it. If the user selects NO, the dialog will proceed to examine the failure for fillet 930. If the user selects YES, the dialog will proceed with cylindrical extrusion 940.

Figure 11:
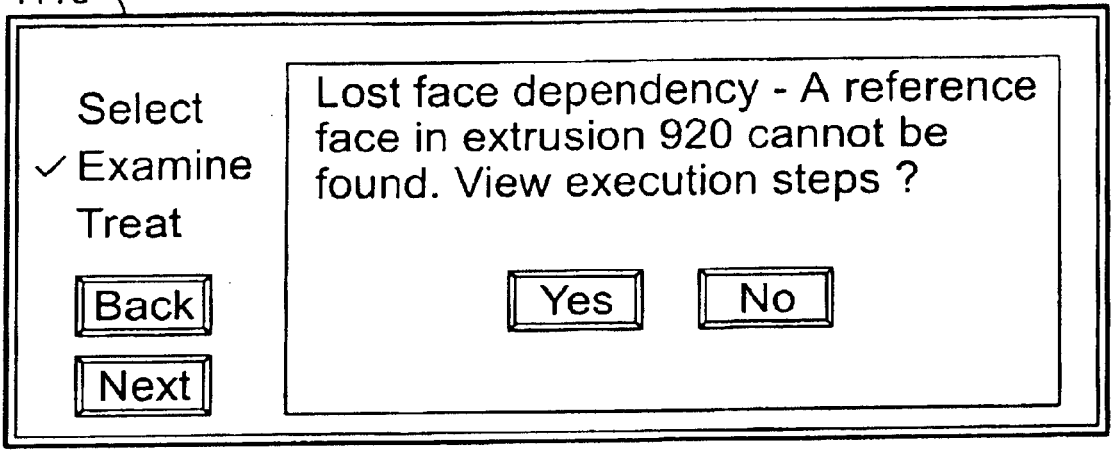

FIG. 11 illustrates examination of cylindrical extrusion 940. In examine window 1110, a more detailed description of the failure is given. Here, the error is a lost dependency error so there is no point of reference to add a representation of the failed feature. Instead, the user is given the opportunity to view execution of the assembly.

Execution can be viewed in any number of ways, including those discussed above. In one embodiment, the dialog windows overlay the user interface shown in FIG. 2 so that error recovery unit 170 can use the functions of the user interface to display the assembly, highlight various features, change perspectives, step through execution of the assembly, etc.

Figure 12:
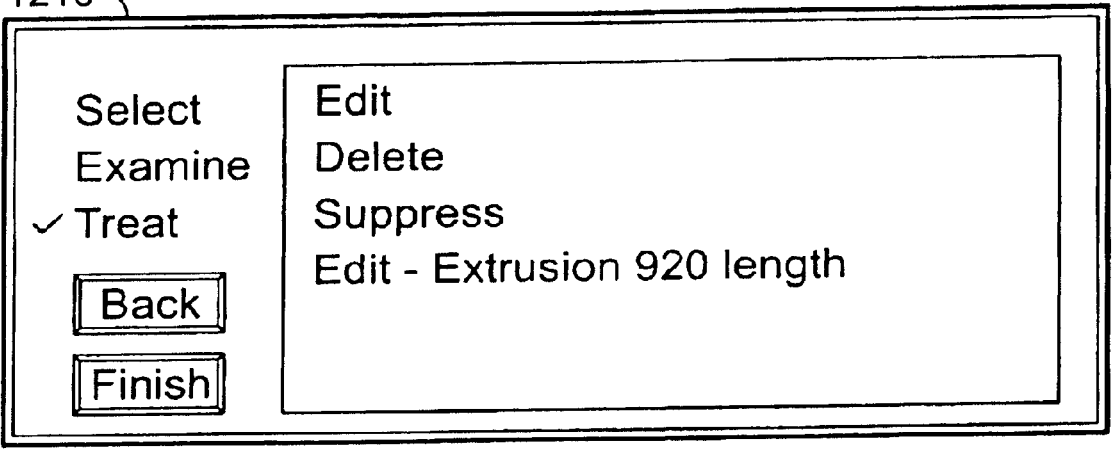
Figure 12:
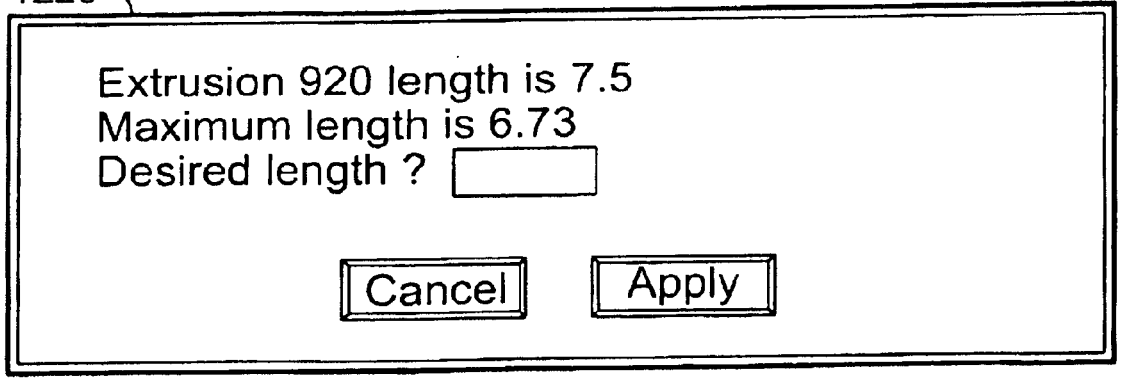

FIG. 12 illustrates treatment of the failure initiated from treat window 1210. After a user has had a chance to examine a failure and understand what needs to be changed in examine window 1110, treat window 1210 provides a set of treatments that are applicable to the failed feature. In the illustrated embodiment, a user can select edit, delete, or suppress, and the treatment will be initiated automatically.

In addition, the user is presented with a targeted edit treatment. A targeted edit treatment is specifically designed for a particular failure. In one embodiment, targeted edit treatments are provided for a set of common failures for which specific treatments can be reliably predicted. As with examination procedures discussed above, based on the description provided herein, those skilled in the art will recognize that countless targeted edit treatments can be created for numerous particular failures. The number and sophistication of targeted edit treatments depends primarily on the available processing power and the time and money software developers are willing to invest.

For the failed dependency error illustrated in FIG. 9C, error recovery unit 170 may identify the feature on which the failed feature depends and attempt to identify a parameter which is responsible for the failure. As shown in FIG. 9A, the failed feature depends on extrusion 920, and it is the length of extrusion 920 that causes the failure. To identify the responsible parameter, error recovery unit 170 could deterministically adjust parameters of extrusion 920 until face 950 on which feature 940 depends is located. That is, by sufficiently reducing the length of extrusion 920, face 950 appears.

Once the responsible parameter is identified, an acceptable value, or a range of acceptable values, can be calculated. For instance, the entire CAD assembly could be scanned for every feature that is dependent on the particular parameter. In the illustrated embodiment, fillet 930 also depends, although indirectly, on extrusion 920. Fillet 930 requires enough space to round the edge of cylindrical extrusion 940 using a specified radius. Therefore, the length of extrusion 920 must be short enough to round the opening of cylindrical extrusion 940.

As illustrated in FIG. 12, if the user selects the targeted edit treatment and clicks on FINISH, a specifically designed user interface, such as window 1220, may be provided. The length of extrusion 920 can be directly and automatically edited in window 1220. The range of acceptable values is also provided.

Although the present invention is described in the context of the exemplary embodiments resented in the figures, those skilled in the art will appreciate that the present invention is not limited to these embodiments and may be practiced in a variety of alternate embodiments. Accordingly, the innovative features of the present invention may be practiced in a system of greater or lesser complexity than that of the system depicted.

Figure 13:
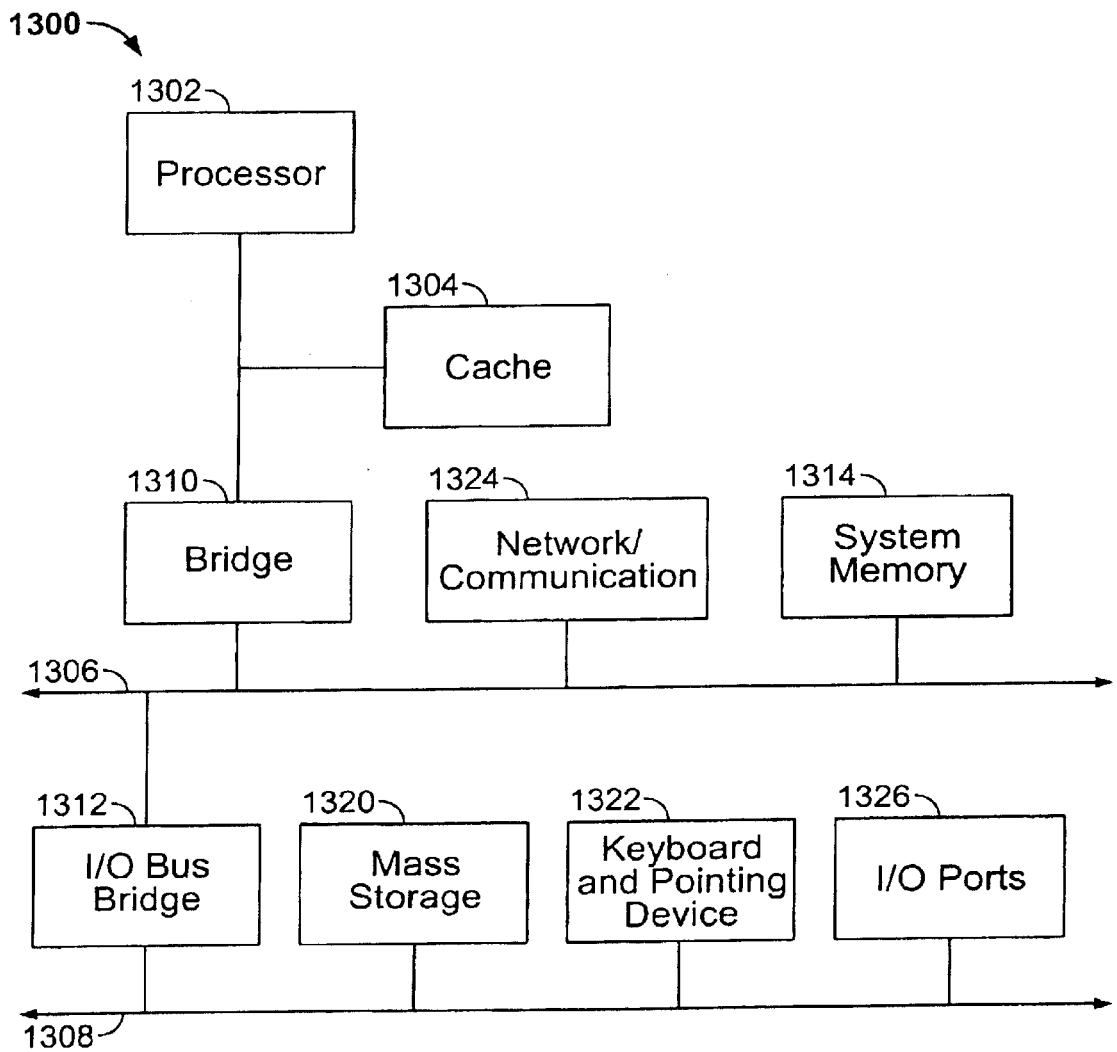
FIG. 13 illustrates one embodiment of a computer system to perform the functions of the present invention.

FIG. 13 illustrates one embodiment of a computing device suitable to implement the functions of error recovery unit 170 of FIG. 1A. In the illustrated embodiment of FIG. 13, computing device 1300 includes processor 1302 and cache memory 1304 coupled to each other as shown. Additionally, device 1300 includes high performance input/output (I/O) bus 1306 and standard I/O bus 1308. Host bridge 1310 couples processor 1302 to high performance I/O bus 1306, whereas I/O bus bridge 1312 couples the two buses 1306 and 1308 to each other. Coupled to bus 1306 are network/communication interface 1324 and system memory 1314. Coupled to bus 1308 is mass storage 1320, keyboard and pointing device 1322, and I/O ports 1326. Collectively, these elements are intended to represent a broad category of hardware systems, including but not limited to general purpose computer systems based on the Pentium® processor, Pentium® Pro processor, or Pentium® II processor, manufactured by Intel Corporation of Santa Clara, Calif.

These elements 1302–1326 perform their conventional functions known in the art. In particular, network/communication interface 1324 is used to provide communication between device 1300 and any of a wide range of conventional networks, such as an Ethernet, token ring, the Internet, etc. It is to be appreciated that the circuitry of interface 1324 may be dependent on the type of network to which device 1300 is coupled.

Mass storage 1320 is used to provide permanent storage for the data and programming instructions to implement the above described functions, whereas system memory 1314 is used to provide temporary storage for the data and programming instructions when executed by processor 1302. I/O ports 1326 are one or more serial and/or parallel communication ports used to provide communication between additional peripheral devices which may be coupled to device 1300.

It is to be appreciated that various components of device 1300 may be re-arranged. For example, cache 1304 may be on-chip with processor 1302. Alternatively, cache 1304 and processor 1302 may be packaged together as a "processor module", with processor 1302 being referred to as the "processor core". Furthermore, certain implementations of the present invention may not require nor include all of the above components. For example, network/communications interface 1324 and I/O ports 1326 may not be included in device 1300. Additionally, the peripheral devices shown coupled to standard I/O bus 1308 may be coupled to high performance I/O bus 1306; in addition, in some implementations only a single bus may exist with the components of device 1300 being coupled to the single bus. Furthermore, additional components may be included in device 1300, such as additional processors, storage devices, busses, or memories.

Figure 14:
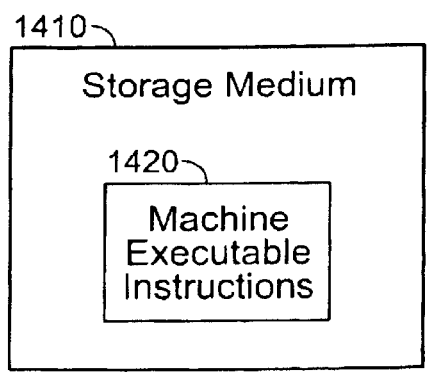
FIG. 14 illustrates one embodiment of a machine readable storage medium having stored thereon machine executable instructions to implement the functions of the present invention.

In one embodiment, error recovery unit 170 of FIG. 1A, as discussed above, is implemented as software routines run by device 1300 of FIG. 12. These software routines comprise a plurality or series of machine executable instructions to be executed in a hardware system, such as by processor 1302 in device 1300 of FIG. 13. Initially, the series of instructions are stored on a storage device, such as mass storage 1320. As illustrated in FIG. 14, the machine executable instructions 1420 can be stored using any conventional storage medium 1410, such as a diskette, CD-ROM, magnetic tape, DVD, laser disk, ROM, Flash memory, etc. It is also to be appreciated that the series of instructions need not be stored locally, nd could be received from a remote storage device, such as a server on a network, via network/communication interface 1324. The instructions are copied from the storage device, such as mass storage 1320, into memory 1314 and then accessed and executed by processor 1302. In one implementation, these software routines are written in the C++ programming language. It is to be appreciated, however, that these routines may be implemented in any of a wide variety of programming languages.

In alternate embodiments, the present invention is implemented in discrete hardware or firmware. For example, one or more application specific integrated circuits (ASICs) could be programmed with the above described functions of the present invention. By way of another example, error recovery unit 170 could be implemented in one or more ASICs of an additional circuit board for insertion into hardware system 1300 of FIG. 13.

Thus, an improved method and apparatus for error recovery in a CAD environment is described. Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims.

What is claimed is:

1. A method comprising:

identifying a failure within a first failed feature in a computer aided design (CAD) assembly comprising a plurality of features; and automatically providing a set of treatments for the failure within the first failed feature from which to select a treatment applicable to the failure, where;

said set of treatments is based at least in part on the failure within the first failed feature;

said failure is resulting from modifications of one or more features of the CAD assembly; and the first failed feature is excluded from the CAD assembly.

2. The method of claim 1 further comprising:

identifying failures within a plurality of additional failed features among a plurality of features comprising the CAD assembly; and automatically providing a plurality of respective sets of treatments for each failure within the plurality of additional failed features from which to select a treatment for a corresponding failure, each of said plurality of respective sets of treatments based at least in part on a corresponding failure.

3. The method of claim 1 wherein the identifying is based at least in part on at least one of an error message or a warning message generated during execution of the CAD assembly.

4. The method of claim 1 further comprising:

generating a diagnosis object for each failed feature of the CAD assembly, each diagnosis object comprising information to facilitate at least one of identifying or illustrating at least one failure in a respective failed feature;

storing each diagnosis object in memory;

retrieving a diagnosis object from the memory corresponding to the first failed feature based on an indication of the first failed feature; and providing information to facilitate at least one of identifying or illustrating the failure in the first failed feature based on the diagnosis object corresponding to the first failed feature.

5. The method of claim 4 wherein the information comprises at least one of a CAD assembly identifier, a failure text description, a feature identifier, an instance transform, a feature geometry, a feature coordinate set, a failure result type, or a set of feature dependencies.

6. The method of claim 1 further comprising:

receiving a selection indicating the first failed feature.

7. The method of claim 6 wherein receiving the selection comprises at least one of receiving a pointer command from a browser that lists the first failed feature;

receiving a toolbar command followed by a pointer indication in a list including the first failed feature; or receiving a menu command followed by a pointer indication in a list including the first failed feature.

8. The method of claim 6 further comprising:

providing an indication of at least one primary failed if the first failed feature is a secondary failed feature;

providing an option to select from at least one primary failed feature if the first failed feature is a secondary failed feature; and if a primary failed feature is selected, then providing a set of treatments applicable to the primary failed feature.

9. The method of claim 1 further comprising at leas one of:

providing a detailed textual description of the failure within the first failed feature;

designating the first failed feature in a graphical representation of the CAD assembly;

stepping through execution of the CAD assembly; or listing at least one feature upon which the first failed feature depends.

10. The method of claim 9 wherein providing the detailed textual description comprises at least one of:
providing at least one of an error message or a warning message corresponding to the failure within the first failed feature, said at least one of an error message or a warning message being generated during execution of the CAD assembly;
providing an extended message from a data structure of extended messages based on the failure within the first failed feature; or
providing a calculated response based on a deviation of the failure within the first failed feature from acceptable values.

11. The method of claim 9 wherein designating the first failed feature comprises at least one of:
implementing a command to toggle highlighting of a representation of the first failed feature;
sonaring in on the representation; or
zooming in on the representation.

12. The method of claim 11 further comprising:
generating at least one of a set of at least one edge of the first failed feature, a set of at least one surface of the first failed feature, or a graphical error icon for use as the representation of the first failed feature, wherein the representation indicates where the first failed feature would have been generated in the CAD assembly.

13. The method of claim 9 wherein stepping through execution of the CAD assembly comprises at least one of:
executing only a next feature in the CAD assembly after receiving a next feature indication from a user;
sequentially executing the CAD assembly at a reduced rate;
pausing execution after each feature on which the first failed feature depends is executed; or
designating only a most recently executed feature in the CAD assembly as the CAD assembly is executed.

14. The method of claim 1 further comprising:
receiving a selection indicating one treatment of the set of treatments; and
automatically initiating the selected one treatment.

15. The method of claim 14 wherein the set of treatments comprises at least one of an edit treatment, a delete treatment, a suppress treatment, a reorder treatment, or a targeted edit treatment, and wherein automatically initiating the selected one treatment comprises at least one of:
opening the user interface used to create the CAD assembly;
deleting the first failed feature from the CAD assembly;
suppressing the first failed feature in the CAD assembly;
moving the first failed feature to a different place in an execution sequence of the CAD assembly; or
opening a reduced function user interface to edit a parameter of the first failed feature predicted to be responsible for the failure within the first failed feature.

16. The method of claim 15 wherein opening the user interface comprises at least one of:
zooming in on coordinates of the first failed feature in the CAD assembly;
designating the first failed feature in the CAD assembly; or
rolling back execution of the CAD assembly to just before execution of the first failed feature.

17. The method of claim 15 wherein moving the first failed feature comprises at least one of:
receiving a user indication of where the first failed feature should be moved; or
receiving a selection indicating a suggested location for the first failed feature.

18. The method of claim 15 wherein opening the reduced function user interface comprises:
opening a parameter editing field; and
suggesting at least one of a value and a value range for the parameter.

19. The method of claim 1 wherein automatically providing the set of treatments comprises:
accessing a plurality of available treatments, each of said available treatments including a list of failures to which the respective treatment applies;
comparing the failure within the first failed feature to the list of failures for each of said available treatments; and
generating the set of treatments based on the comparing.

20. An apparatus comprising:
first logic to identify a failure within a first failed feature in a computer aided design (CAD) assembly comprising a plurality of features; and
second logic to automatically provide a set of treatments for the failure within the first failed feature from which to select a treatment applicable to the failure, where:
said set of treatments is based at least in part on the failure within the first failed feature;
said failure is resulting from modifications of one or more features of the CAD assembly; and
the first failed feature is excluded from the CAD assembly.

21. The apparatus of claim 20 further comprising:
third logic to receive a selection indicating the first failed feature; and
fourth logic to provide information to facilitate at least one of identifying or illustrating the failure within the first failed feature.

22. The apparatus of claim 20 further comprising:
third logic to receive a selection indicating one treatment of the set of treatments; and
fourth logic to automatically initiate the selected treatment.

23. A machine readable storage medium having stored thereon machine executable instructions, execution of said instructions to implement a method comprising:
identifying a failure within a first failed feature in a computer aided design (CAD) assembly comprising a plurality of features; and
automatically providing a set of treatments for the failure within the first failed feature from which to select a treatment applicable to the failure, where:
said set of treatments is based at least in part on the failure within the first failed feature;
said failure is resulting from modifications of one or more features of the CAD assembly; and
the first failed feature is excluded from CAD assembly.

24. The machine readable storage medium of claim 23 having stored thereon machine executable instructions, execution of said instructions to implement the method further comprising:
receiving a selection indicating the first failed feature; and
providing information to facilitate at least one of identifying or illustrating the failure within the first failed feature.

25. The machine readable storage medium of claim 23 having stored thereon machine executable instructions, execution of said instructions to implement the method further comprising:

receiving a selection indicating one treatment of the set of treatments; and automatically initiating the selected treatment.

26. The method of claim 1, further comprising receiving a selection of a treatment from the set of treatments;

executing the treatment to resolve the failure within the first failed feature; and including the first failed feature with the failure resolved in the CAD assembly.

27. The apparatus of claim 20, further comprising third logic to receive a selection of a treatment from the set of treatments;

fourth logic to execute the treatment to resolve the failure within the first failed feature; and fifth logic to include the first failed feature with the failure resolved in the CAD assembly.

28. The machine readable storage medium of claim 23 having stored thereon machine executable instructions, execution of said instructions to implement the method further comprising:

receiving a selection of a treatment from the set of treatments;

executing the treatment to resolve the failure within the first failed feature; and including the first failed feature with the failure resolved in the CAD assembly.

* * * * *

UNITED STATES PATENT AND TRADEMARK OFFICE
CERTIFICATE OF CORRECTION

PATENT NO. : 6,888,542 B1
DATED : May 3, 2005
INVENTOR(S) : James M. Clauss

It is certified that error appears in the above-identified patent and that said Letters Patent is hereby corrected as shown below:

Title page,
Item [56], References Cited, OTHER PUBLICATIONS,
replace "Weitzman, Artifical Intelligence in Engineering Design" with
-- Weitzman, Artificial Intelligence in Engineering Design --; and
"Fischer et al., Design Envirnoments" with -- Fischer et al., Design Environments --.

Column 12,
Line 53, replace "one primary failed" with -- one primary failed feature --.
Line 55, replace "from at least one primary" with -- from the at least one primary --.
Line 61, replace "comprising at leas one" with -- comprising at least one --.

Signed and Sealed this

Fourth Day of April, 2006

JON W. DUDAS
*Director of the United States Patent and Trademark Office*